United States Patent [19]
Huang et al.

[11] Patent Number: 4,999,842
[45] Date of Patent: Mar. 12, 1991

[54] QUANTUM WELL VERTICAL CAVITY LASER

[75] Inventors: Kai-Feng Huang, Shenchu, China; Jack L. Jewell, Bridgewater, N.J.; Samuel L. McCall, Jr., Gillette, N.J.; Kuochou Tai, North Plainfield, N.J.

[73] Assignee: AT&T Bell Laboratories, Murray Hill, N.J.

[21] Appl. No.: 317,699

[22] Filed: Mar. 1, 1989

[51] Int. Cl.$^5$ .............................. H01S 3/19
[52] U.S. Cl. ...................... 372/45; 372/49; 372/50; 372/99; 357/4; 357/17; 357/19
[58] Field of Search ............ 372/45, 43, 50, 49, 372/96, 99, 38; 357/17, 4, 16, 19

[56] References Cited

U.S. PATENT DOCUMENTS

| 4,675,876 | 6/1987 | Svilans | 372/96 |
| 4,764,931 | 8/1988 | Matsuda | 357/19 |
| 4,845,723 | 7/1989 | Heinen et al. | 372/38 |

FOREIGN PATENT DOCUMENTS

| 0152684 | 8/1984 | Japan | 372/45 |
| 0097684 | 5/1985 | Japan | 372/45 |
| 0004291 | 1/1986 | Japan | 372/45 |
| 0079280 | 4/1986 | Japan | 372/45 |
| 0269594 | 11/1988 | Japan | 372/45 |

OTHER PUBLICATIONS

Y. Arakawa and A. Yariv, *IEEE J. Quantum Electron.*, QE-21, p. 1666 (1985, Oct.).
P. L. Gourley and T. J. Drummond, Single Crystal, Epitaxial Multilayers of AlAs, GaAs, ad $Al_xGa1-_xAs$ for Use of Optical Interferometric Elements, *App. Physics Lett.* 49 (9), Sep. 1, 1986.
K. Y. Lau et al., *Ultimate Limit in Low Threshold Quantum Well GaAlAs Semiconductor Lasers*, App. Physics Lett. 52 (2), Jan. 11, 1988.
J. W. Matthews and A. E. Blakeslee, J. Cryst. Growth, vol. 27, p. 118 (1974 Jul.).
A. Y. Cho, "Film Deposition by Molecular-Beam Techniques", *J. of Vac. Science and Technology*, vol. 8, p. 531 (Jun. 25, 1971).
R. D. Dupuis, *High Efficiency GaAlAs/Heterostructure Solar Cells Grown by Metalorganic Chemical Vapor Deposition*, Applied Phys. Letters, vol. 31, Aug. 1, 1977.
J. P. Van der Ziel and M. Ilegem, *Appl. Opt.*, vol. 14, p. 2627, Nov. 1975.

Primary Examiner—Georgia Epps
Attorney, Agent, or Firm—G. S. Indig

[57] ABSTRACT

Distributed feedback mirror cavities are found capable of sufficient reflectance-loss characteristics to permit lasing in two or a single quantum well structure in which lasing is in the thin (quantum) dimension. Such lasers sometimes known as "quantum well surface emitting lasers" are of sufficiently low threshold value as to permit use in integrated circuits of high integration density—e.g. at 1 micron design rules. Anticipated uses, now made possible, include optical circuitry for computer chip interconnect as well as optoelectric integrated circuits for many purposes including computing itself.

21 Claims, 5 Drawing Sheets

QUANTUM WELL VERTICAL CAVITY LASER

BACKGROUND OF THE INVENTION

No technology has had as profound an influence as the integrated circuit. Most of the wonders of our society would be impossible without it. A single example, the modern computer, plays a role that affects the wellbeing of people in every walk of life and in every country.

It has been confidently predicted for many years that future generation integrated circuits would include or even take the fundamental form of integrated photonic rather than electronic devices. While many uses may involve optical pumping, most significant impact is expected to depend upon electrical pumping. From this standpoint, that is from the standpoint of laser operation, per se, and also from the standpoint of functions to be performed, most valuable implementation will take the form of the Opto Electronic Integrated Circuit. Included electronics—generally semiconductor electronics—will serve to operate lasers as well as to interact between photonics and electronics generally.

Contemplated uses for integrated lasers—largely represented by OEIC's—include integration with the driving electronics itself as well as inclusion of elements to provide for interaction both within photonic parts of the circuit and between photonic and electronic parts. Examples of purely photonic interaction include laser-to-detector. There are many examples of the second category.

While overcoming limitations of present day electronic computers will, by all estimates, lead to assignment of at least some computer functions to lasers, intermediate development is expected to take the form of optical interconnection to overcome present limits interposed by hard wiring. Realization of optical interconnect, chip-to-chip as well as within chip, will be dependent upon a high degree of integration consistent with low cost.

Other uses for OEIC's as identified in recent literature include imaging, image processing and optical gas detection.

Full implementation of the integrated laser, e.g. of the OEIC, will take advantage of very profound emerging processing advances. Demonstrated techniques have, for example, depended on close lattice matching, but have also taken advantage of defect minimization afforded through growth of extremely thin layers in non-lattice matched epitaxy as well. Such considerations have been quite valuable in conjunction with evolving Quantum Well structures with their well appreciated performance advantages (low threshold, narrow bandwidth, high brightness, high effiency). See Y. Arakawa and A. Yariv, *IEEE J. Quantum Electron.* QE-21, 1666 (1985). Remarkable developments confirm the likelihood of commercial abricattion of discrete QW laser structures in the near future. Dislocation densities have been reduced. Useful Distributed Feed Back mirrors have been built without need for cleavage (by Molecular Beam Epitaxy as well as by Metal Organic Chemical Vapor Deposition.

It is confidently expected that most valuable use will entail a high level of integration. The most significant obstacle to laser integration is power dissipation. The present level of silicon Large Scale Integration is attributable to the very low power requirements for operation. In the limit, power dissipation, some finite fraction of power input, limits the number of devices that may be integrated on a chip, or, in more general terms, the fraction of wafer area devoted to active use. Now available silicon LSI "megachips", soon to yield to still greater miniaturization and integration density, are critically dependent on this consideration. By the same token, relative lack of progress in laser integration must be ascribed to the relatively high required threshold power levels.

Extensive literature clearly shows that workers, worldwide look to QW laser structures as promising from the standpoint of threshold power. Much of the reported work until recently has dealt with edge-emitting structures in which the initially emitted beam is parallel to the major substrate surface. Such structures, while very significant, are not regarded as offering the lower threshold power levels needed for desired integration density.

Very promising recent results involve Quantum Well Vertical Cavity Lasers. As the terminology implies, the emitted beam is now initially non-parallel —generally normal—to the major substrate surface, or more generally, non-parallel to the major dimensions of the quantum well (parallel to the critical quantum well dimension). Representative work is described by Gourley et al in *Applied Physics Letters*, 49 (9), p. 489 (1 Sept. 1986). In this work conducted at Sandia National Laboratories, the authors describe a passive structure (no non-linear active material) consisting of a cavity of GaAs bounded by DFB mirrors of alternating layers of GaAs and AlAs. The quarter-wave mirror structures in the described experiment consisted of eight layers each of the two materials. Excellent properties observed showed a 54 Å centered transmission band at a wavelength of 0.956 nm. The authors report certain properties from which it is possible to calculate absorption/scattering losses of their structure. Properties reported include a peak transmittance of 45%, as well as their calculated "ideal structure" transmittance of 68%.

Much of the work concerning QWVCL's has involved direct use of the initially vertically directed emitted beam. This is of value, for example, in chip-to-chip communication and in certain other instances in which laser output is to be coupled with external circuitry. The vertical structure, however, also offers low threshold-related advantages for use involving communication within the chip (or under other circumstances in which coupling is in a direction parallel to the major substrate plane). For such purposes, the initially non-parallel beam as emitted by the laser may be redirected, for example, by use of a mirror or prism external to the cavity itself. Such mirrors, likely DFB's, of the same nature discussed in conjunction with the cavity itself could be fabricated as part of an integrated circuit. In passing, it may be noted that while "surface emitting" structures are generally though of in terms of true vertical cavities, there is no reason why they cannot be at some other angle to facilitate desired operation, emitting at 90° or any other out-of-plane angle, or even emitting in-plane. It is implicit, as well, that "surface emitting" may not mean *free* surface emitting. "Surface emitting" has reference only to the surface of the concerned mirror defining the laser cavity. This "surface" may, in fact, be an interface with some other material/element, e.g., may relate to the interface with a prism or other element designed to direct the beam. (Use of the term, Quantum Well Vertical Cavity Laser, is designed to avoid some of these implied, but unintended limitations).

The Gourley et al article is representative of the most advanced state of the art at least in terms of DFB mirror cavities. It serves as basis for explaining the general view that a small number of quantum wells is inadequate for lasing. A Fabray-Perot etalon has a net maximal transmission of $T^2/(T+A)^2$, a relationship well-known to workers in relevant fields and found in many textbooks on optics. T is the transmittance of a single mirror of the Fabray-Perot etalon and A is the fraction of energy absorbed by the same mirror. Energy not transmitted or absorbed is reflected. For quarter wavelength interference mirrors in their 8 layer pair GaAs-AlAs mirror structure, one obtains reflectivity very close to 93.6% and a transmittance of 5.2% per mirror. Subtracting the sum of 93.6% +5.2%=98.8% from 100% yields a loss of 1.2% per single pass. Lasing requires a gain of greater than 1.2% in the active structure to offset this loss. Gains offered by quantum well structures are significantly less than 1.2%. For example, the authors of "Ultimate Limit in Low Threshold Quantum Well GaAlAs Semiconductor Lasers", *Applied Physics Letters*, Vol. 52, pp. 88–90, 11 Jan. 1988, reported experimental results which indicate a maximum achievable gain of 0.3% for a SQW based on quantum wells made of GaAs a well-studied representative member of the promising class of compound semiconductors.

For the author's mirror structure, reflectance values needed for lasing for a small number of quantum wells (four or fewer), twenty or more mirror pairs are required for needed reflectance. Based on the very conservative estimate that the 1.2% loss for the eight pair cavity is not increased at all for the required number of pairs, still results in the conclusion that lasing threshold has not been reached. Stated differently, the results of this reported work lead directly to the conclusion that a minimum of four quantum wells is necessary to offset loss and thereby achieve lasing in the best available materials.

It is the general view that lasing materials within the compound semiconductor families (III-V's, II-VI's and usual ternary, quaternary and higher order materials) have similar maximum gains, i.e. within the range 0.2%–0.4%. All numbers are for single quantum well structures with effective gain for multiple structures increasing linearly as the number of wells increases ($2\times 0.2\% = 0.4\%$ to $4\times 0.2\% = 0.8\%$ or 0.4%–0.8% for a duplex structure). In addition, cavity efficiency is dependent upon mirror efficiency which, in turn, varies ~as the reciprocal of the difference in refractive index between the two successive layered mirror materials ($\Delta$ n). Since, in general, refractive index for suitable mirror materials varies less for increasing wavelength, $\Delta$ n values are typically less so that a greater number of layers is generally required for the necessary cumulative reflectivities.

The work reported above represents the worldwide view that attainable vertical cavity structures (QWVCL's) require a threshold level of at least 3,000 amperes/square centimeter (3mA/100 $\mu m^2$) in order to offset unavoidable losses in the cavity. The primary implication of this conclusion is relevant to minimum required power dissipation and, therefore, to maximum integration density. This understanding is equivalent to the accepted view that lasing in QW structures is not attainable for structures containing fewer than a minimum of four quantum wells. Whereas requirements vary at different wavelengths and in accordance with other factors (e.g. available $\Delta$ n's), the general view is that such considerations are not at variance—in fact often suggest still greater numbers of wells.

Much of the above is concerned primarily with light pumping. Accordingly, conclusions in the literature relative to required gain, numbers of quantum wells, etc. are largely derived from reported work on light pumping. As indicated, anticipated value, while not ignoring light pumping, is primarily in electrical pumping. All of the reported work is relevant to electrical pumping. On the other hand, it is well known that achievements in optical pumping have not been duplicated in the electrical analog. For example, whereas there is a body of reported work on optically pumped devices operating cw at room temperature, reported electrically pumped devices, have, in the main, been pulsed, or if cw, have been cooled.

SUMMARY OF THE INVENTION

Fundamentally, the invention derives from the conclusion that distributed feedback mirrors have better attainable characteristics than previously believed. The inventive finding of unexpectedly good reflectivity v loss characteristics has extremely significant characteristics in terms of all Quantum Well Vertical Cavity Lasers—electrically pumped as well as optically pumped.

Implications of the invention are significant in terms of discrete devices since more effective cavitation permits lasing for lower threshold—for less efficient active materials as well as for lesser numbers of quantum wells—as few as two, or even one. Most significantly, however, implications of the invention are in terms of integration. The inventive finding, in giving rise to lower threshold, results in lower power dissipation. Specific structures of the invention—primarily laser-including integrated circuits are possible because of low needed heat dissipation—e.g. in terms of lower permitted device threshold power—as corresponding with small numbers of QW's—two or even one (Single Quantum Well structures). Inventive devices are described also in terms of the larger fraction of free wafer surface that may be used for active lasing which translates into permitted integration density, and in turn, generally into permitted design rules.

While structures of the invention are naturally utilized for chip-to-chip (or generally to offchip) communication, other structures provide for out-of-plane emission beams, e.g. by redirection with mirrors or prisms, to enable within-chip communication.

DETAILED DESCRIPTION

Drawing

Figure 1:
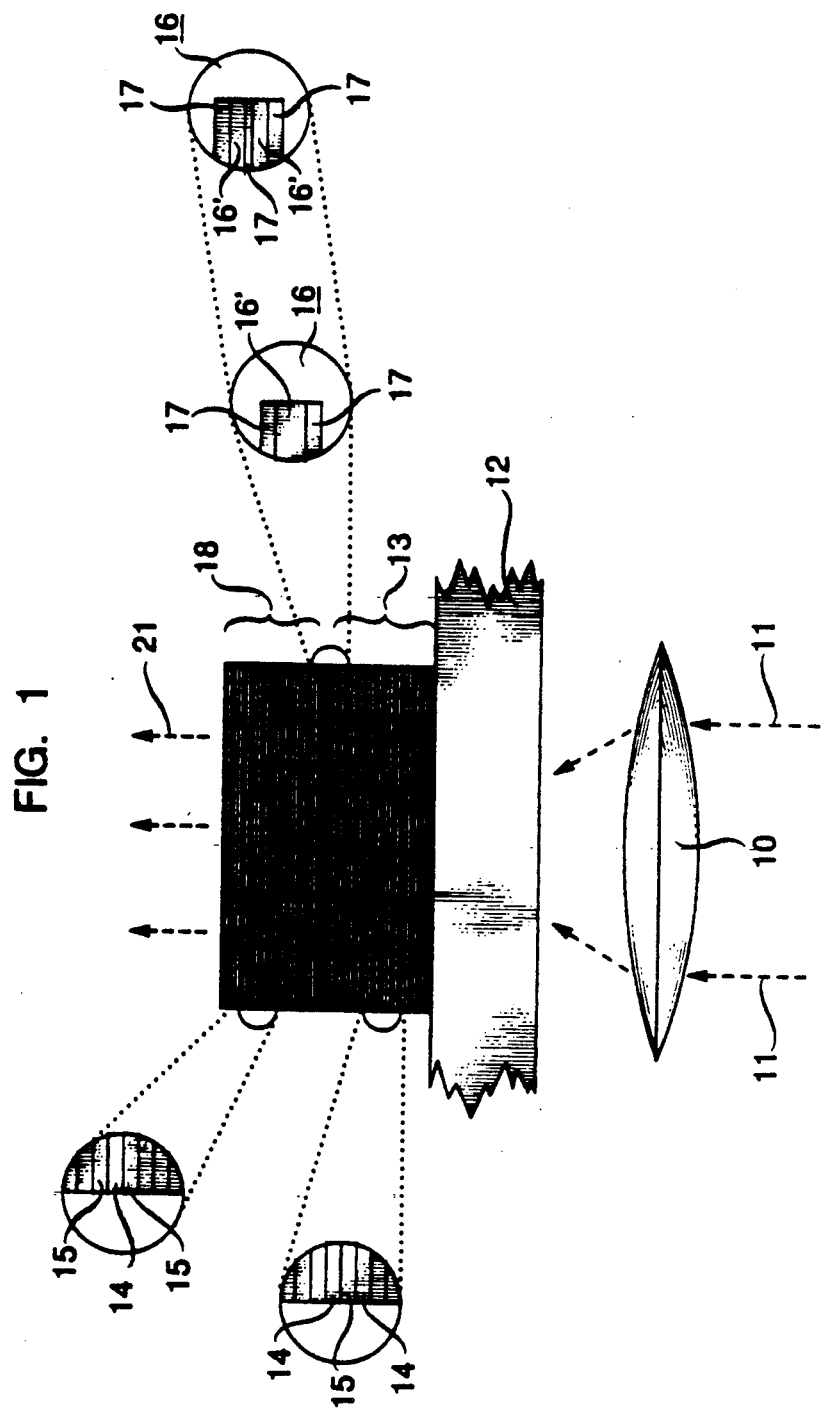
FIG. 1 is a schematic diagram showing a front elevational view of a light pumped QW laser of the invention.

FIG. 1 depicts an optically pumped SQW structure consisting of lens 10 for directing incoming radiation 11 which first passes through substrate 12 and thereafter through DFB mirror 13 composed of alternating pairs of high and low refractive index material 14 and 15, respectively. Radiation thereafter is introduced into QW structure 16 consisting of one or two quantum wells 16' embedded in barrier material 17. The structure is completed by mirror 19 which similar to 13 is made up of alternating layers of high and low refractive index material 14 and 15. In the arrangement shown, the emitted lasing beam emerges vertically upward as shown by the arrows.

Figure 2:
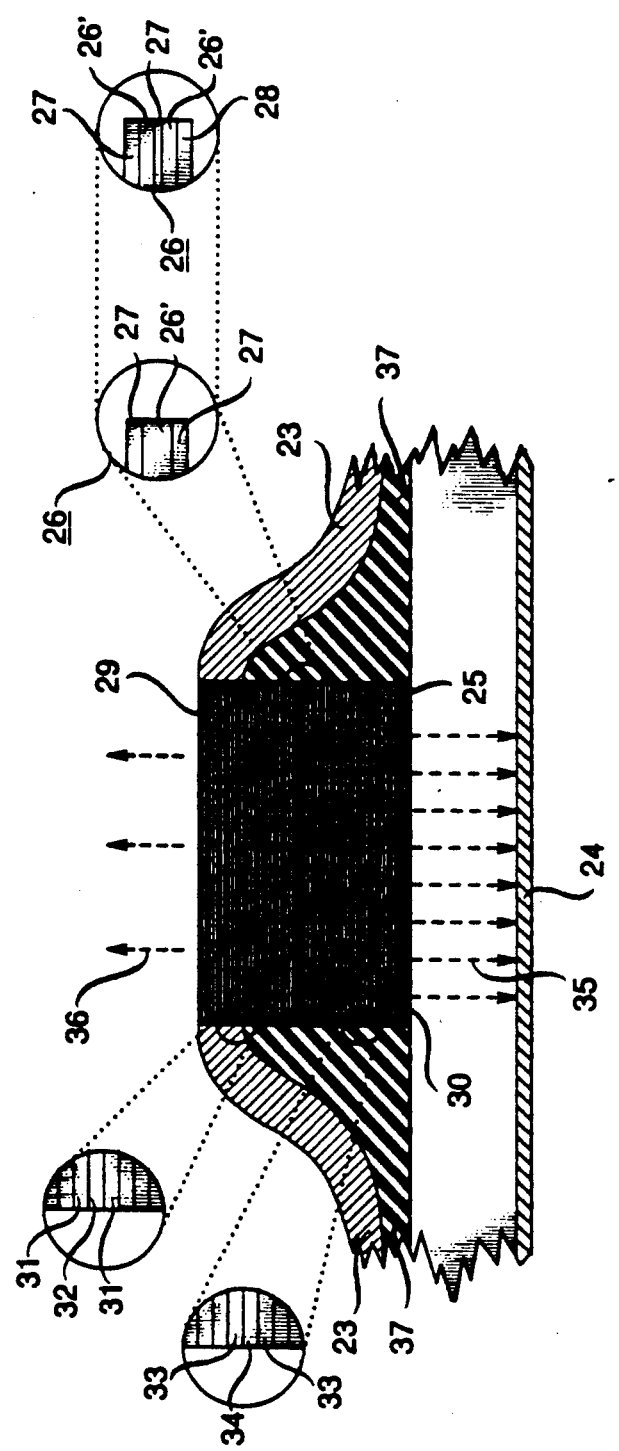
FIG. 2 is an elevational view of a similar quantum well structure in which pumping is electrical.

The structure of FIG. 2 is similar to that of FIG. 1 but provides for electrical rather than optical pumping via electrodes 23 and 24. The structure 25 is similar to that of FIG. 1 and again consists of QW structure 26 made up of well/s 26' embedded in barrier material 27. Cavitation as in FIG. 1 is the consequence of DFB mirrors 29 and 30 each again consisting of quarter wavelength layers, in this instance of alternating refractive index 31, 32 and 33, 34 which may be the same for both mirrors). In this instance, mirrors 29 and 30 are doped, one with n-type, the other with p-type dopant to produce the pn junction responsible for generation of carriers in the usual manner for electrically pumped semiconductor lasers. Current pumping produced by means of electrical source not shown, results in current flow between electrodes 23 and 24 in the form of current represented by arrows 35. The emerging laser beam, again upwardly directed, is represented by arrows 36. Region 37 is composed of dielectric material.

Figure 3:
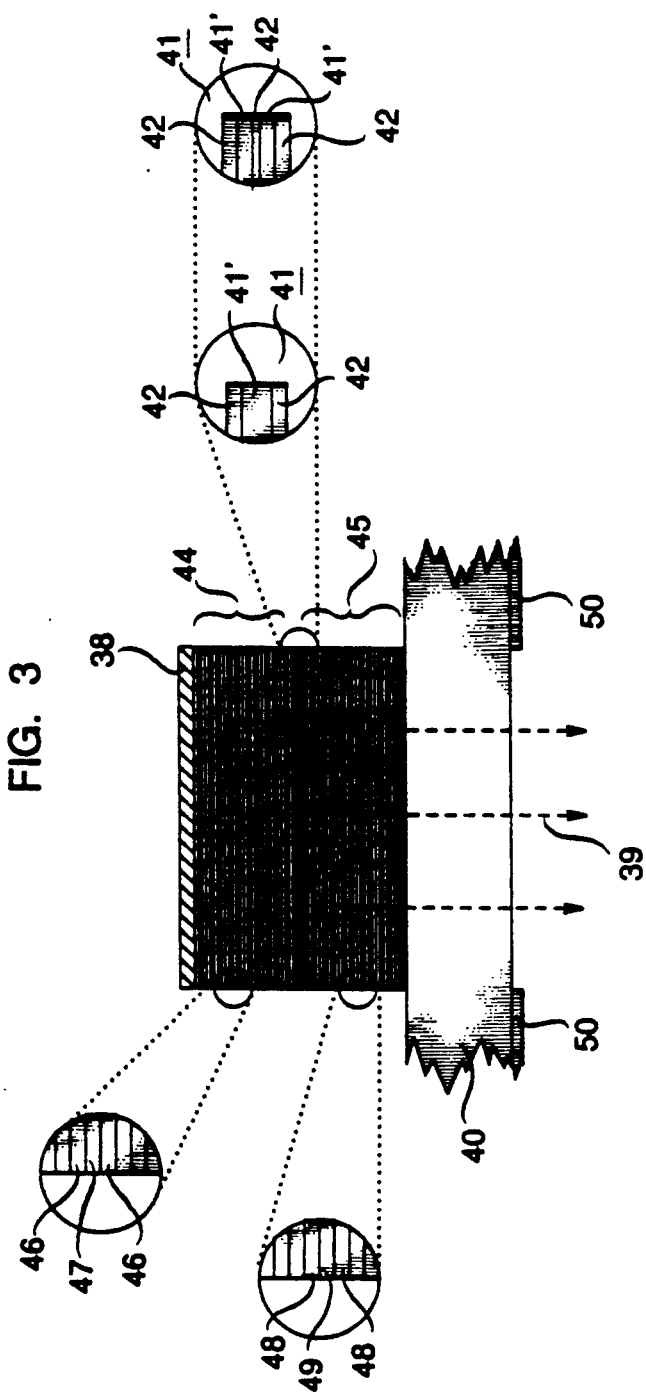
FIG. 3 depicts a device design alternative to that of FIG. 2 using a different electrode arrangement.

The structure of FIG. 3 is functionally similar to FIG. 2 and differs primarily in providing for a face electrode 38 of sufficient reflectivity so that emission is in the form of a downward-directed beam 39 shown in the form of arrows emerging from the underside of substrate 40. Otherwise, the structure is as shown in FIG. 2, being composed of active quantum well structure 41, either one or two wells comprising active material 41' embedded in barrier material 42. Mirrors 44 and 45, composed of alternating high and low refractive index layers 46, 47 and 48, 49, respectively, complete the structure optically. Electrical pumping from means not shown, is across electrodes 38 and 50.

Figure 4:
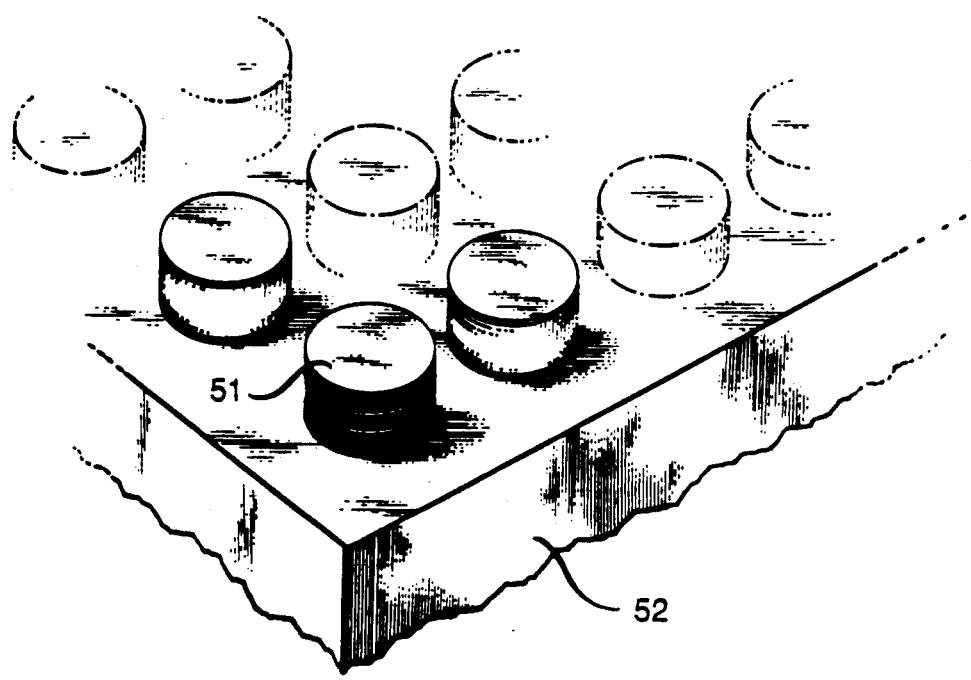
FIG. 4 is a perspective view of a portion of an integrated circuit including an array of surface emitting lasers.
Figure 5:
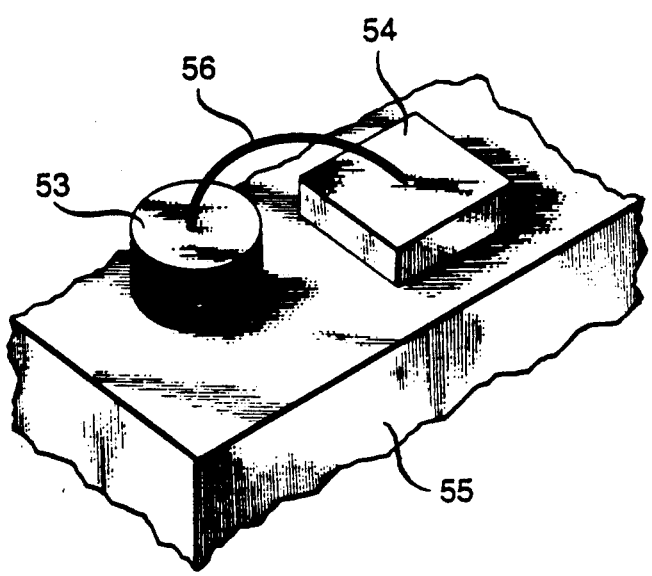
FIG. 5, also in perspective, depicts an integrated circuit containing a laser structure, such as depicted in FIG. 4, together with electronic drive circuitry.
Figure 6:
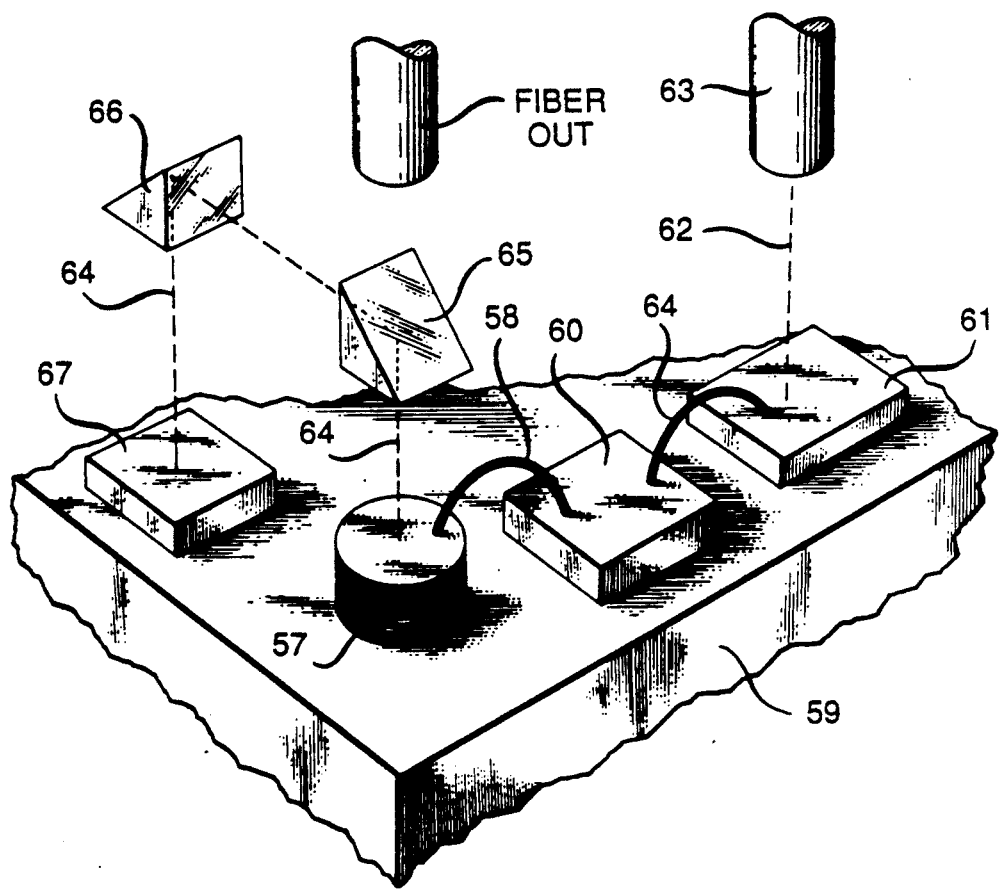
FIG. 6 is a perspective view of a circuit portion including electronic structure for performing functions in addition to that required for driving the laser, e.g. so as to permit operation as an optical fiber communication repeater. The figure provides for an-in-plane laser beam to permit within-chip communication.

FIG. 4 depicts an array of lasers 51 which may be of the detailed design shown in any of FIGS. 1 through 3. As in those figures, lasers 51 are supported on a substrate, in this instance 52, upon which an in at least some instances, they were grown, for example, by Molecular Beam Epitaxy. Lasers depicted in this figure as well as in FIGS. 5 and 6 are exaggerated in dimension in the lasing direction. In general, they are only a few microns in height.

FIG. 5 shows a portion of an OEIC. The portion shown consists simply of a laser 53 together with drive electronics 54 both on common substrate 55. The arrangement is schematically shown as connected via lead 56 with the electrical circuit being completed by a common substrate lead.

FIG. 6 is representative of an important aspect of the invention and shows an integrated circuit including both a laser 57 driven via lead 58 and the conducting surface of substrate 59 by driving circuitry 60. The structure shown provides for an optic-to-electronic detector 61 which upon detecting light beam 62 as received from incoming optical fiber 63 converts it to an electrical impulse introduced into the driving circuit 60 by means of lead 64 and the surface of substrate 59. The integrated circuit shown provides for within-chip communication by redirecting vertically emitting beam 64 by means of prisms 65 and 66 to result in beam 64 being made incident on detector 67.

Materials

A first requirement for optimum structures in accordance with the invention is sufficient crystalline perfection—sufficient absence of dislocations—to permit operation as discussed later. Whereas it would be desirable that all materials utilized be of identical crystalline lattice constants in the appropriate directions, other (device-significant) considerations sometimes dictate choice of materials that are not precisely matched. It is well known in the art that sufficient freedome of dislocations ("quasimorphic" structures) are attainable with materials of differing lattice constants. Appropriate growth conditions which depend, inter alia, on the degree of difference of the constants, on growth conditions, on total thickness grown, etc. are discussed, for example, by J. W. Matthews and A. E. Blakeslee, *J. Cryst. Growth*, Vol. 27, p. 1187 (1974).

From the functioning standpoint, chosen materials must have properties known to be appropriate for operation. Active material of which the quantum well is composed, must have a direct energy bandgap suitable for the desired radiation wavelength, and must otherwise be suitable for lasing. As in usual quantum well structures, the active material is embedded in barrier material (is sandwiched between two barrier layers). Barrier material, also a direct bandgap material, has a higher energy gap and serves the function of confinement of carriers within the active material.

Mirror structures are composed of alternating layers of material of differing refractive index. Commensurate with usual desired properties of low loss, chemical stability, etc., the difference in index $\Delta n$ should be as large as possible since the required number of layers for a desired reflectance is smaller for large $\Delta n$. In general, otherwise suitable mirror materials of a $\Delta n$ of at least 0.2 (expressed as the difference between the two refractive indices expressed in usual dimensionless quantities relative to vacuum) may be used.

In many of the structures described, electrodes are provided with apertures for emitting beams so that the requirements are uncomplicated by laser function, e.g., pertains to electrical and fabrication properties such as e.g. conductivity, adherence, stability, etc. In certain instances, where device design provides for passage of light (either pump or emitting beam) through an electrode, the electrode material is applied as an extremely thin layer.

An important category of the invention-structures that rely on electrical pumping, provide for current passage through portions of the structure that serve an optical function. Considerations, well known to those in the field generally pertain to usual impurity doping to provide needed conductivity.

Electrically pumped structures require pn junctions—require both p and n type material. As suggested, the two embracing mirror assemblies are oppositely doped, one p type the other n type, again in accordance with well-understood technology, e.g. as developed to an advanced state relative to edge-emitting quantum well structures.

The inventive teaching relies on the high level of development to which the relevant laser art has been developed. In general, active materials—appropriate direct bandgap materials—are the compound semiconductors such as selected materials of the III-V, the II-VI, and the ternaries, quaternaries as well as are complex compositions. In common with reported laser work, such active materials may be true compounds—sometimes partially substituted, or functioning may be dependent upon inclusion of critical dopants. Again, the inventive teaching does not depend on designation of appropriate lasing compositions. Illustrative active materials suitable for the inventive structures, as well as for prior art structures, are listed. It is well known that desired lasing wavelength, while necessarily permitted by the bandgap of the active material, depends to some extent on other considerations including well-dimension positioning within the cavity, nature of the barrier material, etc. Appropriate active material-barrier material couples together with typical lasing wavelengths are listed: GaAs/AlGaAs—0.85 $\mu$m; $In_{0.53}Ga_{0.47}As/InP$—1.55 $\mu$m; $In_{0.2}Ga_{0.8}As/GaAs$—1$\mu$m.

Processing

Processing details are also not a necessary part of this disclosure. Actual device operation upon which the disclosure is based was observed on devices constructed by MBE. (See A. Y. Cho, *J. Vac. Sci. Techno.*, Vol. 8, p. 531 1971.) Alternatively, use may be made of MOCVD. (See R. D. Dupuis et al, *Appl. Phys. Letters*, Vol. 31, p. 201 1978.)

Structure

Detailed structural considerations are not required here. The field of QW lasing is under intensive study worldwide. Relevant design criteria as applied to reported structures, surface emitting as well as edge emitting, are applicable to structures of the invention. The invention in preferred embodiments, of course, uses the best quantum structures. The inventive advance takes advantage of the best active quantum structures in conjunction with cavity designs which cooperate to result in the invention.

It is known that quantum structures depend upon wells of critical thickness. Effective thickness dimension is dependent upon a number of factors i.e. actual dimension of the active material itself, most importantly as affected by barrier characteristics. Barrier characteristics of consequence largely in the confining of excited carriers within the active material are primarily in terms of energetic barrier height and bandgap size. In principle, there is no limitation on minimum thickness other than continuity—stimulated emission has been observed in structures of one or two atom thickness. There is a permitted maximum in fundamental terms—thicknesses sufficiently great to permit stacked excitons result in bulk rather than quantum well properties. Generally, experimental work reported herein with thickness of about 80Angstrom, is a reasonable compromise. Very thin layers are more likely to have more consequential surface roughness (properly considered as a fraction of total thickness) while thicknesses very much larger than 100-120Angstrom unit result in bulk properties. A useful reference authored by Arakawa and Yariv is *IEEE Journal of Quantum Electronics* Vol. 21, p. 1666, 1985.

As a general premise, precise dimensions of the barrier material are non-critical. Experiments suggest that so long as there is a continuous coating of barrier of a few atoms thickness, the primary function of carrier confinement is satisfied. In practice, however, it is convenient to adjust barrier thickness so that it, together with the active material, defines the "spacer" dimension to attain most effective resonant quality. This gives rise to inclusion of at least one barrier layer thickness which is at least as large or larger than that of an individual mirror layer.

DFB mirror structures are, again, well known. (See J. P. van der Ziel and M. Ilegem, *Appl. Opt.* 14, 2627, 1975.) The basic requirement is for alternating layers of relatively high and low refractive index with layer thicknesses such as to permit resonance—most effective structures utilized quarter wavelength thicknesses. Assuming other desired characteristics, such a chemical stability, low absorption loss, etc. are satisfied, optimization is in the direction of largest available $\Delta$ n as discussed above.

It is usual to discuss DFB mirror structures in terms of layer pairs. The practice is followed in this description. In these terms the inventive advance is based on the observation that a laser gain, less than previously thought suitable, is sufficient to offset the total loss introduced by the many-layered DFB mirror required for necessary reflectance. (It is appreciated that reflectance v loss mirror characteristic is complex—e.g. increasing the number of layers decreases transmission loss while increasing most other losses—while increasing absorption and scattering losses. While transmission loss is an example of a calculable value based on the number of layers and on $\Delta$ n, other losses are not intrinsic.) The invention has been described as a departure from the previous general understanding that "ideal" structures—structures having only calculable losses are inadequate for lasing of single or double quantum well structures. Stated differently, the invention depends upon the finding that "ideal" structures—in fact practically attainable structures—are characterized by sufficiently good properties to permit lasing of single or double quantum well structures. In general, for practically available $\Delta$ n values and available QW gain, cavity structures are characterized by mirrors of perhaps 22 or preferably (at least from the operational standpoint) 24 or more layer pairs.

There are many considerations that lead to unbalanced mirror structures. These have to do with practical considerations. Common mirror design criteria dictate the use of bounding mirror layers of the larger index of refraction. Accordingly, if otherwise permitted, both the uppermost and lowermost mirror layers has the larger index of the two alternating materials. Experiments reported herein, however, since using a substrate of the same composition as that of the larger index mirror material, must use the lower index material in the lower mirror. This is needed to define the critical quarter wavelength layer.

Certain structures of the invention make use of unbalanced mirror reflectances. When device requirement is for a single output direction, it may be achieved by increasing reflectance to a greater value at the non-emitting side. One manner for accomplishing this is to provide a greater number of layers at the non-emitting side of the cavity. The same imbalance serves a fundamental purpose: since each additional mirror layer reduces transmission while increasing reflectance, and assuming non-critical added absorption/scattering loss, the desire for higher reflectance, and therefore accommodation of lower threshold, is satisfied without penalty by increasing the number of layers on the non-transmitting side of the cavity. This gives rise to a preferred structure in accordance with the invention—unbalanced structures providing for a larger number of layers (more generally for a greater reflectance) in the non-emitting mirror. In principle, the maximum number of layers is, in any event, no greater than that corresponding with the crossover at which added loss per added layer exceeds reduced pump transmission loss per added layer. In practice, mirror structures may have fewer layers than this maximum since "incalculable" losses (e.g. absorption, scattering) give rise to an effective crossover for a smaller structure and/or because of fabrication cost/complexity. Stated differently, an important aspect of the invention—cavity structures depending upon observed excellence of reflectance v loss characteristics—is properly stated as permitting attainment of needed cavitation to accomplish lasing for relatively low gain structures (single or duplex QWVCL's) including those in which the improvement is ascribed more to one mirror structure than to the other.

In conservative terms, based on experimental verification, it is possible to estimate needed structure to attain lasing. Realized gain values for SQW structures are ~0.3%. Taking this number into account and considering real cavity characteristics in accordance with the invention, this gives rise to a need for cavity reflectance of ~99.7%. The estimated requirement for a duplex structure (total quantum wells) is 99.4%. For a $\Delta$ n value of 0.6 (for GaAs-AlAs mirrors), this translates into balanced structures of ~22 and 24 pair mirrors. As discussed above, this structure might be modified slightly to increase preference for one transmission direction and for other practical reasons.

THE EXAMPLES

Example 1

A single quantum well structure of the design shown in FIG. 1, utilizes an 80Å thick well of area about 400 square micrometers, composed of $In_{0.2}Ga_{0.8}As$ sandwiched between 1290Å barrier layers of GaAs. The upper mirror structure is composed of 24 pairs of quarter-wavelength thick layers of GaAs and AlAs. GaAs has the greater index (~3.5), AlAs has the smaller (~2.9). Quarter wavelength for GaAs is 670Å while for AlAs it is 802Å. The GaAs substrate—of non-critical dimension—is 500 μm. MBE epitaxial layer growth is on a substrate of crystallographic orientation (100). The structure is pumped by a synchronously pumped dye laser emitting at a wavelength of 860 nm. At this wavelength, pump energy is absorbed in every part of the structure containing Ga—in the GaAs mirror layers as well as in the active and barrier materials. The output laser beam, as emitted through the substrate, has a center wavelength of 980 nm. Lasing threshold is 7 microwatts per square micrometer.

Example 2

Example 1 is repeated, however, substituting a pump wavelength of 880 nm. At this wavelength only the active material—the In-containing material—absorbs. Threshold is about the same and it is not apparent that either example is fundamentally preferable. The observation is ascribed to the surmise that the greater absorption by use of the 860 nm pump does not result in 100% carrier transfer to the active region.

Other Considerations

As stated the inventive advance builds on the very considerable prior art. While this description is not intended as an exhaustive text on fundamental theory/design, it is useful to consider certain matters that are particularly relevant.

From the fabrication standpoint preferred aspects of the invention depend upon true SQW's. It is known that quantum well structures (which for this purpose may include barrier material and even some part of adjacent mirror) are characterized by a wavelength range over which lasing is permitted. Active structures support standing waves. Effective amplification of resonating energy requires placement of the quantum well as nearly coincident with an energy peak of the standing wave as possible. The finite band of laser wavelengths available—those within the band permitted by the active material—permits and, in fact results, in accommodation so that the quantum well is indeed coincident with a peak. More complex structures—those containing two quantum wells may or may not accommodate depending upon other structural considerations—for example, thickness of barrier material between the wells. For some designs, where intermediate barrier layer thickness is small, accommodation is as for the SQW—the combined thickness of two ~80Å is small relative to a half-wave. In certain instances, it has been found useful to deliberately separate quantum wells using a thick barrier layer over spacing such that each may correspond with a different half-wave peak.

In summation inventive finding is based in large part upon the fact that the crossover—the number of DFB mirror layers beyond which further added layers result in added loss which offsets added reflectance—is such that cavitation for as few as one or two quantum wells, emitting in their critical thickness direction may be achieved. While value should not exclude discrete devices, worth is defined largely in terms of integrated devices. For most purposes, the value of integration increases as integration density increases. Structures of the invention, particularly those in which the lasing direction is normal to the wafer plane, are well suited to integration since they are more nearly scalable than most structures. Integrated lasers of the invention may usefully be of maximum dimension as large as 100 μm or larger (10,000 μm²). For many purposes, smaller structures are appropriate. Results indicate that scaling may be carried through 100 μm and 10 μm at least down to 1 μm.

In the terminology generally used in integration, e.g. in large scale integration, the term "design rule" has reference to minimum feature size (as well as to other considerations such as spacing between features, etc.). In these terms circuits may be described as of design rules corresponding with the dimensions listed above.

Reflectance v loss characteristics which provoked much of this work translates into required $\Delta$ n values as small as 0.2 or even 0.1.

Where face electrodes such as shown in FIG. 3 are to be used on the emitting side of the laser structure, usual metallic layers must be very thin e.g. 50Å or smaller.

We claim:

1. Apparatus comprising quantum well laser vertical cavity structure for lasing in a direction non-parallel to the major dimensions of a quantum well, such laser consisting essentially of an active element containing one or two quantum wells and a cavity dependent upon reflectance as between two distributed feedback mirrors.

2. Apparatus of claim 1 in which the said active element contains one or two quantum wells of a compound semiconductor material and in which the wells are bounded in the lasing direction by barrier material.

3. Apparatus of claim 2 in which reflectance on at least one side of the active element is entirely due to distributed feedback.

4. Apparatus of claim 3 in which cavity reflectance is greater than about 99.7% and in which the active element is a single quantum well.

5. Apparatus of claim 1 comprising a circuit inluding at least one one element in addition to said laser.

6. Apparatus of claim 5 including at least two lasers each of the characteristics of said laser.

7. Apparatus of claim 5 including at least one electronic element.

8. Apparatus of claim 7 in which the said laser is pumped by the said electronic element.

9. Apparatus of claim 1 comprising an integrated circuit on a wafer and in which the emitting laser beam is upwardly directed.

10. Apparatus as described in claim 9 provided with means for redirecting the emitting beam for within-chip communication.

11. Apparatus of claim 1 in which the active laser material of which the quantum well/s essentially consists is a compound semiconductor.

12. Apparatus of claim 11 in which the compound semiconductor is of a family selected from the group consisting of III-V's, II-VI's, ternary, quaternary and more complex related compound semiconductors.

13. Apparatus of claim 12 in which the quantum well/s is of a critical well-defining dimension of up to 120 Å and in which such well/s is bounded on both sides in the direction of such dimension by a barrier material which confines excited carriers within such well.

14. Apparatus of claim 13 in which means is included for light pumping to induce lasing.

15. Apparatus of claim 13 in which means is included for electrical pumping to induce lasing.

16. Apparatus of claim 15 in which said distributed feed back reflectance and in which lasing emission is primarily in the direction of lesser reflectance.

17. Apparatus of claim 15 in which DFB mirrors consist essentially of sequential pairs of mirror material layers of high and low refractive index, respectively.

18. Apparatus of claim 17 in which paired mirror layers differ in refractive index by a value of $\Delta n$ of at least 0.1.

19. Apparatus of claim 18 in which $\Delta n$ is at least 0.2 and in which at least one mirror includes at least 22 pairs of mirror material.

20. Apparatus of claim 19 in which both mirrors include at least 22 pairs of mirror material.

21. Apparatus of claim 19 in which the active elements has a gain of at least about 0.3 and in which $\Delta n$ is at least 0.2.

* * * * *